(12) United States Patent
Son et al.

(10) Patent No.: US 11,534,859 B2
(45) Date of Patent: Dec. 27, 2022

(54) SUBSTRATE TREATMENT APPARATUS

(71) Applicant: SEMES Co., Ltd., Chungcheongnam-do (KR)

(72) Inventors: Duk Hyun Son, Chungcheongnam-do (KR); Hyung Joon Kim, Gyeonggi-do (KR)

(73) Assignee: Semes Co., Ltd., Chungcheongnam-do (KR)

( * ) Notice: Subject to any disclaimer, the term of this patent is extended or adjusted under 35 U.S.C. 154(b) by 0 days.

(21) Appl. No.: 17/388,356

(22) Filed: Jul. 29, 2021

(65) Prior Publication Data

US 2021/0354236 A1 Nov. 18, 2021

Related U.S. Application Data

(63) Continuation-in-part of application No. 16/682,333, filed on Nov. 13, 2019, now abandoned.

(30) Foreign Application Priority Data

Nov. 28, 2018 (KR) .................. 10-2018-0149761

(51) Int. Cl.
*H01L 21/68* (2006.01)
*B23K 26/042* (2014.01)
(Continued)

(52) U.S. Cl.
CPC .............. *B23K 26/042* (2015.10); *B25J 9/04* (2013.01); *B25J 9/08* (2013.01); *B25J 9/10* (2013.01);
(Continued)

(58) Field of Classification Search
CPC ................ B65G 47/905; H01L 21/681; H01L 21/68707
See application file for complete search history.

(56) References Cited

U.S. PATENT DOCUMENTS

| 7,109,510 | B2 | 9/2006 | Radahl | |
|---|---|---|---|---|
| 2018/0297194 | A1* | 10/2018 | Lei | ................ B25J 15/0014 |
| 2020/0024726 | A1* | 1/2020 | Moradian | ......... H01L 21/67184 |

FOREIGN PATENT DOCUMENTS

| JP | 0831913 A | 2/1996 |
|---|---|---|
| KR | 20040013195 A | 2/2004 |

(Continued)

OTHER PUBLICATIONS

Korean Grant of Patent issued in Korean Patent Application No. 10-2018-0149761, dated Nov. 5, 2020, with translation, 3 pages.

(Continued)

*Primary Examiner* — Gerald McClain
(74) *Attorney, Agent, or Firm* — RatnerPrestia

(57) ABSTRACT

A substrate treatment apparatus includes a transport part to transport a transparent rectangular substrate, a substrate support part to support the substrate, light generators to irradiate two different lights onto the moving substrate, and sense the irradiated lights, and a controller to determine a posture of the substrate with reference to the sensed lights and control the transport part such that the substrate is seated on the substrate support part in a default posture that is preset. The controller determines the posture of the transparent rectangular substrate with respect to the default posture using a time difference between a time point at which a first light of the two different lights is not transmitted through an edge of the transparent rectangular substrate and a time point at which a second light of the two different lights is not transmitted through the edge of the transparent rectangular substrate.

5 Claims, 10 Drawing Sheets

(51) Int. Cl.
  *B25J 9/04* (2006.01)
  *G03F 9/00* (2006.01)
  *B25J 9/10* (2006.01)
  *B25J 9/08* (2006.01)

(52) U.S. Cl.
  CPC .......... *G03F 9/7003* (2013.01); *H01L 21/681* (2013.01)

(56) References Cited

FOREIGN PATENT DOCUMENTS

| KR | 20080040408 A | * | 5/2008 |
| KR | 20080092013 A | | 10/2008 |
| KR | 20090068945 A | | 6/2009 |
| KR | 20130071105 A | | 6/2013 |
| KR | 20160066824 A | | 6/2016 |

OTHER PUBLICATIONS

Korean Office Action issued In Korean Patent Application No. 10-2018-0149761, dated Apr. 17, 2020, 6 pages.
Notification of Reason for Refusal issued in Korean Patent Application No. 10-2018-0149761, dated Aug. 6, 2020, with translation, 12 pages.

* cited by examiner

SUBSTRATE TREATMENT APPARATUS

CROSS-REFERENCE TO RELATED APPLICATIONS

This application is a Continuation-in Part application of U.S. patent application Ser. No. 16/682,333, filed Nov. 13, 2019, which claims priority from Korean Patent Application No. 10-2018-0149761 filed on Nov. 28, 2018 in the Korean Intellectual Property Office, the disclosure of which is incorporated herein by reference in its entirety.

1. FIELD OF THE DISCLOSURE

The present disclosure relates to a substrate treatment apparatus.

2. DESCRIPTION OF THE RELATED ART

When manufacturing a semiconductor device or a display device, various processes such as photolithography, etching, ashing, ion implantation, thin film deposition, cleaning, and the like are performed. Here, the photolithography process includes a coating process, an exposure process, and a developing process. A photoresist is applied onto a substrate (that is, a coating process), a circuit pattern is exposed on the substrate formed with a photoresist film (that is, an exposure process), and an exposed area of the substrate is selectively developed (that is, a developing process).

Various processes may be performed on one substrate, and the processes may be performed in separate chambers that are different from each other. Accordingly, the substrate may be moved between chambers for complete processing of the substrate.

SUMMARY OF THE INVENTION

Aspects of the present disclosure provide a substrate treatment apparatus.

It should be noted that objects of the present disclosure are not limited to the above-described objects, and other objects of the present disclosure will be apparent to those skilled in the art from the following descriptions.

According to an aspect of the present disclosure, there is provided a substrate treatment apparatus including a transport part configured to transport a transparent rectangular substrate, a substrate support part configured to support the transported transparent rectangular substrate, light generators configured to irradiate two different lights onto the transparent rectangular substrate, which is moving, and sense the irradiated lights, and a controller (e.g., microprocessor) configured to determine a posture of the transparent rectangular substrate with reference to the sensed lights and control the transport part such that the transparent rectangular substrate is seated on the substrate support part in a default posture that is preset, wherein the controller determines the posture of the transparent rectangular substrate with respect to the default posture using a time difference between a time point at which a first light of the two different lights is not transmitted through an edge of the transparent rectangular substrate and a time point at which a second light of the two different lights is not transmitted through the edge of the transparent rectangular substrate.

The light generators may include a first light-irradiating part and a second light-irradiating part that are configured to irradiate a first light and a second light in a direction perpendicular to the ground, respectively, and a first light-sensing part and a second light-sensing part that are disposed above or below the first light-irradiating part and the second light-irradiating part, respectively, in a straight line parallel to the ground to sense the irradiated first and second lights, respectively.

The transport part may move the transparent rectangular substrate in a state in which a wide surface of the transparent rectangular substrate is disposed to be parallel to the ground such that the transparent rectangular substrate passes through the first light and the second light in a direction perpendicular to a light irradiation direction of the first light and the second light.

The posture of the transparent rectangular substrate with respect to the default posture may include an angle formed between a direction in which the first light-sensing part and the second light-sensing part are disposed and the edge of the transparent rectangular substrate.

The controller may determine a center line of the transparent rectangular substrate using a time difference between time points at which the first light and the second light are not transmitted through one side edge of the transparent rectangular substrate and time points at which the first light and the second light are not transmitted through the opposite side edge to the one side edge.

The controller may control the transport part such that the center line of the transparent rectangular substrate matches with a center line of the substrate support part.

Other specific contents according to the exemplary embodiments are included in the detailed descriptions and the accompanying drawings.

BRIEF DESCRIPTION OF THE DRAWINGS

The above and other aspects and features of the present disclosure will become more apparent by describing exemplary embodiments thereof in detail with reference to the attached drawings, in which.

DETAILED DESCRIPTION OF THE EMBODIMENTS

Figure 1:
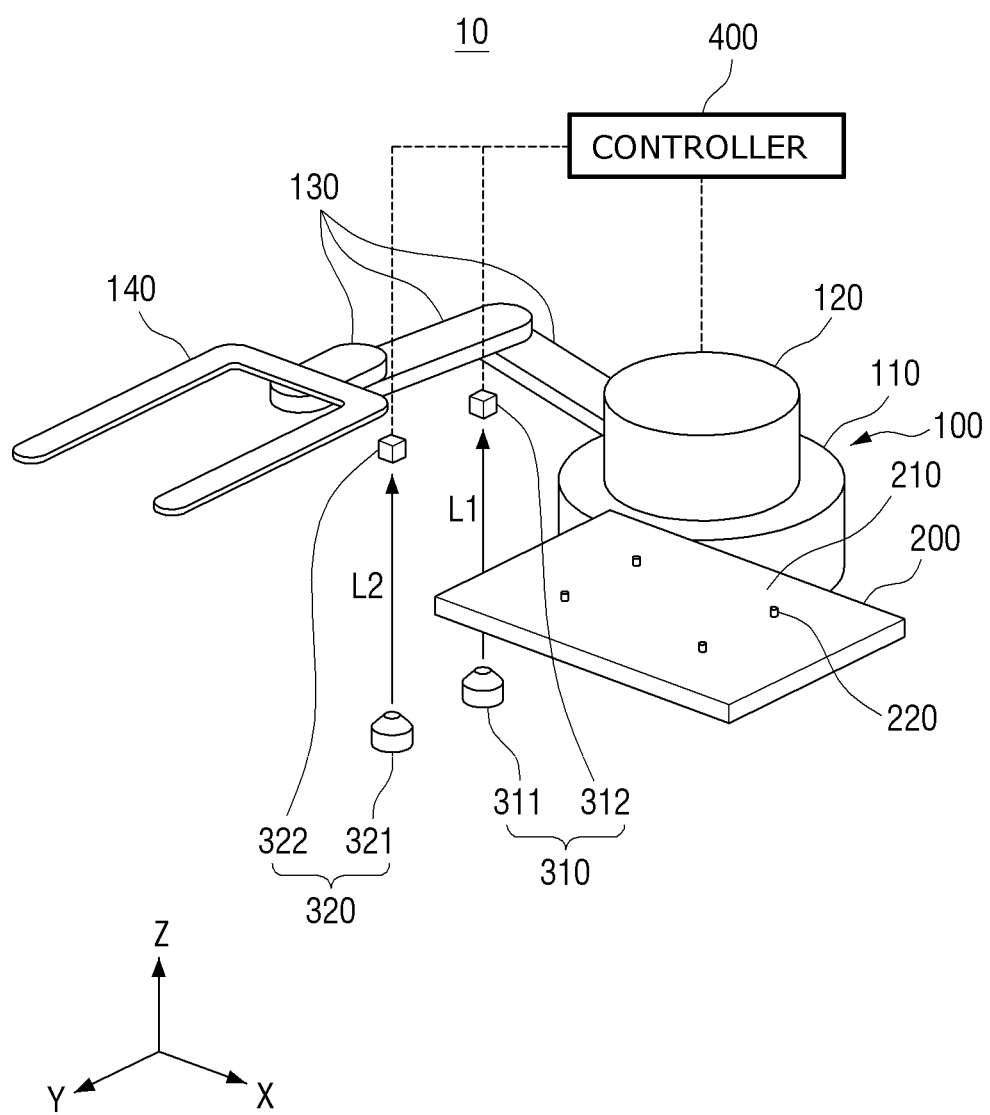
FIG. 1 is a view illustrating a substrate treatment apparatus according to an exemplary embodiment of the present disclosure.

Hereinafter, exemplary embodiments of the present disclosure will be described in detail with reference to the accompanying drawings. The advantages and features of the present disclosure and methods for obtaining the same will be apparent from the following detailed description of the exemplary embodiments described with references to the following drawings. However, the present disclosure is not limited to the exemplary embodiments to be disclosed below and may be implemented in different various forms. The present exemplary embodiments are provided in order to fully explain the present disclosure and fully explain the scope of the present disclosure to those skilled in the art. The scope of the present disclosure is only defined by the appended claims. Like reference numerals refer to like elements throughout the specification.

A case in which an element or layer is referred to as being "on" another element or layer includes a case in which the element is directly present on another element or layer and also includes a case in which the element is present on another element or layer with still another element or layer interposed therebetween. On the other hand, a case in which an element is referred to as being "directly on" another element includes a case in which still another element or layer is not interposed therebetween.

Spatially relative terms such as "below," "beneath," "lower," "above," "upper," and the like may be used to more easily describe a relationship between one element or components and another element or the other components as illustrated in the drawings. The spatially relative terms should be understood to have directions as illustrated in the drawings and have other directions when the elements are used or operated. For example, when an element illustrated in the drawing is turned upside down, the element which is illustrated to be present below or beneath another element may be present above another element. Accordingly, the term "below" used as an example includes both "below" and "above." An element may be arranged in another direction, and thus, the spatially relative terms may be interpreted based on an arrangement direction.

Although first, second, and the like are used to describe various elements, components, and/or sections, the various elements, components, and/or sections are not limited thereto. The terms are only for distinguishing one element or component, or sections from another element or component, or sections. Therefore, a first element, a first component, or a first section may also be a second element, a second component, or a second section in the technical spirit of the present disclosure.

The terms used herein are for the purpose of describing the exemplary embodiments and are not intended to limit the present disclosure. Unless the context clearly indicates otherwise in the specification, the singular forms include the plural forms. The terms "comprises," "comprising," "includes," and/or "including," when used herein, specify the presence of stated features, integers, steps, operations, elements, components and/or groups thereof, and do not preclude the presence or addition of one or more other features, integers, steps, operations, elements, components, and/or groups thereof.

Unless otherwise defined, all terms (including technical and scientific terms) used herein may be used in a sense commonly understood by those skilled in the art to which the present disclosure pertains. It will be further understood that terms, such as those defined in commonly used dictionaries, will not be interpreted in an idealized or overly formal sense unless expressly so defined here.

Hereinafter, the exemplary embodiments of the present disclosure will be described in detail with reference to the accompanying drawings. When the exemplary embodiments are described with reference to the accompanying drawings, components that are the same or correspond to each other are denoted by the same reference numerals regardless of the figure numbers, and redundant descriptions will be omitted.

Figure 2:
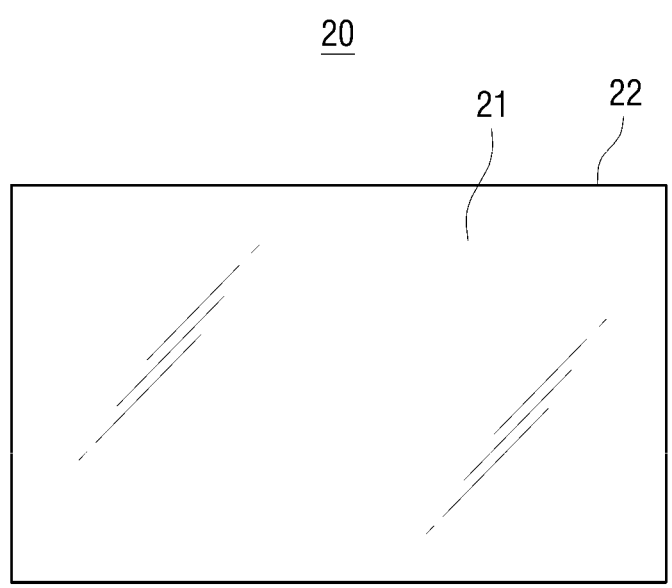
FIG. 2 is a view illustrating a transparent rectangular substrate according to the exemplary embodiment of the present disclosure.
Figure 3:
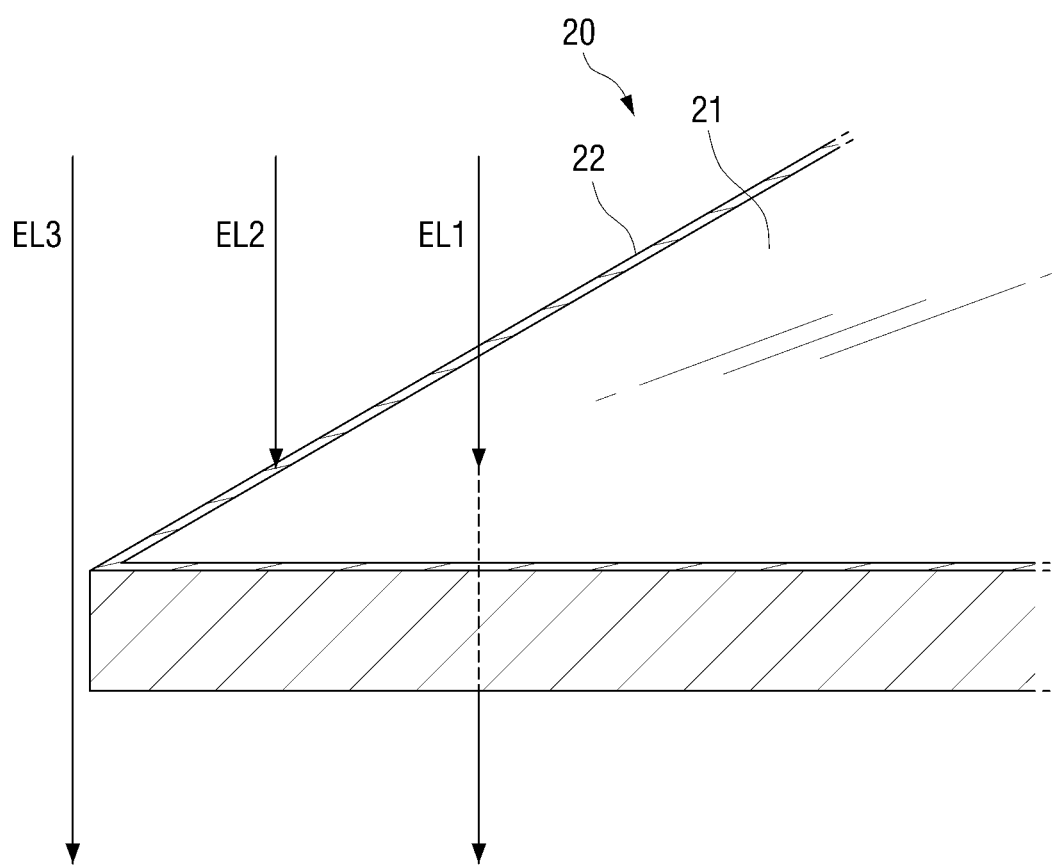
FIG. 3 is a view illustrating light being irradiated onto the transparent rectangular substrate according to the exemplary embodiment of the present disclosure.

FIG. 1 is a view illustrating a substrate treatment apparatus according to an exemplary embodiment of the present disclosure, FIG. 2 is a view illustrating a transparent rectangular substrate according to the exemplary embodiment of the present disclosure, and FIG. 3 is a view illustrating light being irradiated onto a transparent rectangular substrate according to the exemplary embodiment of the present disclosure.

Referring to FIG. 1, a substrate treatment apparatus 10 includes a transport part 100, a substrate support part 200, light generators 310 and 320, and a controller 400. Controller 400 may be a microprocessor, for example.

The transport part 100 serves to transport a transparent rectangular substrate 20.

The transport part 100 includes a fixed part 110, a moving part 120, a robot arm 130, and a hand 140. The fixed part 110 may be fixed to the ground. The ground may be a bottom surface of a chamber (not shown) provided with the substrate treatment apparatus 10. The moving part 120 is movably coupled to the fixed part 110. For example, the moving part 120 may move in a direction perpendicular to the ground with respect to the fixed part 110 or rotate about a rotation axis perpendicular to the ground.

A plurality of robot arms 130 may be provided. The plurality of robot arms 130 may be coupled to be rotatable between adjacent robot arms 130. For example, the robot arms 130, which are adjacent to each other about the rotation axis perpendicular to the ground, may rotate between each other. One of the plurality of robot arms 130 may be coupled to the moving part 120 and moves together with the moving part 120. The hand 140 may be provided on another one of the plurality of robot arms 130. The hand 140 serves to support the transparent rectangular substrate 20. The transparent rectangular substrate 20 may be transported while being supported by the hand 140.

The substrate support part 200 serves to support the transparent rectangular substrate 20 transported by the transport part 100. In a state in which the transparent rectangular substrate 20 is supported on the substrate support part 200, processes such as photolithography, etching, ashing, ion implantation, thin film deposition, and cleaning may be performed. In the present disclosure, a wide surface of the transparent rectangular substrate 20 may have a rectangular shape. Thus, a seating surface 210 of the substrate support part 200, on which the transparent rectangular substrate 20 is seated, may also have a rectangular shape. A support pin 220 may be provided on the substrate support part 200. The support pin 220 serves to separate the transparent rectangular substrate 20 from the seating surface 210 of the substrate support part 200.

The light generators 310 and 320 serve to irradiate two different lights onto the transparent rectangular substrate 20, which is moving, and to sense the irradiated lights.

The light generators 310 and 320 include a first light-irradiating part 311, a second light-irradiating part 321, a first light-sensing part 312, and a second light-sensing part 322.

The first light-irradiating part 311 and the second light-irradiating part 321 serve to irradiate a first light L1 and a second light L2 in a direction perpendicular to the ground, respectively. In the present disclosure, the first light L1 and the second light L2 may be laser lights. The first light-sensing part 312 and the second light-sensing part 322 are disposed above or below the first light-irradiating part 311 and the second light-irradiating part 321, respectively, in a straight line parallel to the ground and serve to sense the first light L1 and the second light L2 that are irradiated by the first light-irradiating part 311 and the second light-irradiating part 321, respectively. FIG. 1 illustrates a case in which the first light-sensing part 312 and the second light-sensing part 322 are disposed above the first light-irradiating part 311 and the second light-irradiating part 321, respectively.

The controller 400 serves to determine a posture of the transparent rectangular substrate 20 with reference to the lights sensed by the first light-sensing part 312 and the second light-sensing part 322 to control the transport part 100 such that the transparent rectangular substrate 20 is seated on the substrate support part 200 in a default posture that is preset.

The transport part 100 may withdraw one transparent rectangular substrate 20 from a carrier (not shown) that accommodates a plurality of transparent rectangular substrates 20. The withdrawn transparent rectangular substrate 20 may be transported by the transport part 100 and seated on the substrate support part 200.

In determining the posture of the substrate by irradiating light onto the substrate, whether the light is sensed may be used. That is, the light is not sensed when the substrate is present in a light irradiation path, and the light is sensed when the substrate is not present in the light irradiation path, and thus, the shape of an edge of the substrate may be determined through whether the light is sensed. Meanwhile, when a surface of a substrate is made of a transparent material, like the transparent rectangular substrate 20 of the present disclosure, light may be transmitted through the substrate. In this case, the light is transmitted even though the transparent rectangular substrate 20 is present in the light irradiation path so that it may not be easy to determine the shape of the substrate by sensing the light.

Accordingly, the controller 400 according to the exemplary embodiment of the present disclosure may determine the posture of the transparent rectangular substrate 20 with respect to the default posture using a time difference between a time point at which the first light L1 of two different lights of the light generators 310 and 320 is not transmitted through an edge of the transparent rectangular substrate 20 and a time point at which the second light L2 of two different lights of the light generators 310 and 320 is not transmitted through the edge of the transparent rectangular substrate 20.

Referring to FIG. 2, the transparent rectangular substrate 20 of the present disclosure may have a rectangular shape and may have a surface made of a transparent material. Accordingly, the light may be transmitted through the surface of the transparent rectangular substrate 20.

Meanwhile, an opaque region 22 is present at the edge of the transparent rectangular substrate 20 in a manufacturing process. Referring to FIG. 3, the transparent rectangular substrate 20 may include a transparent region 21 and the opaque region 22.

The opaque region 22 may be formed along the edge of the transparent rectangular substrate 20. A light EL1 irradiated onto the transparent region 21 of the transparent rectangular substrate 20 may be transmitted through the surface of the transparent rectangular substrate 20. Accordingly, the light-sensing parts 312 and 322 may sense the light EL1 irradiated onto the transparent region 21. In addition, the light-sensing parts 312 and 322 may sense a light EL3 deviated from the edge of the transparent rectangular substrate 20. On the other hand, a light EL2 irradiated onto the opaque region 22 is blocked from being transmitted, and thus, the light-sensing parts 312 and 322 may not sense the corresponding light EL2.

In the present disclosure, two light generators 310 and 320 may be provided to determine the posture of the transparent rectangular substrate 20. By using light patterns sensed by the two light generators 310 and 320, the posture of the transparent rectangular substrate 20 with respect to the default posture may be determined.

In order to determine the posture of the transparent rectangular substrate 20 using the lights by the light generators 310 and 320, the transport part 100 may pass the transparent rectangular substrate 20 through the light generators 310 and 320 while moving the transparent rectangular substrate 20 in a straight direction parallel to the ground. Hereinafter, a direction in which the transparent rectangular substrate 20 passes through the light generators 310 and 320 will be referred to as a first direction X. In addition, a direction parallel to the ground and perpendicular to the first direction X will be referred to as a second direction Y, and a direction perpendicular to the first direction X and the second direction Y will be referred to as a third direction Z. The above-described two light-sensing parts 312 and 322 may be arranged side-by-side in a straight line parallel to the second direction Y.

Figure 4:
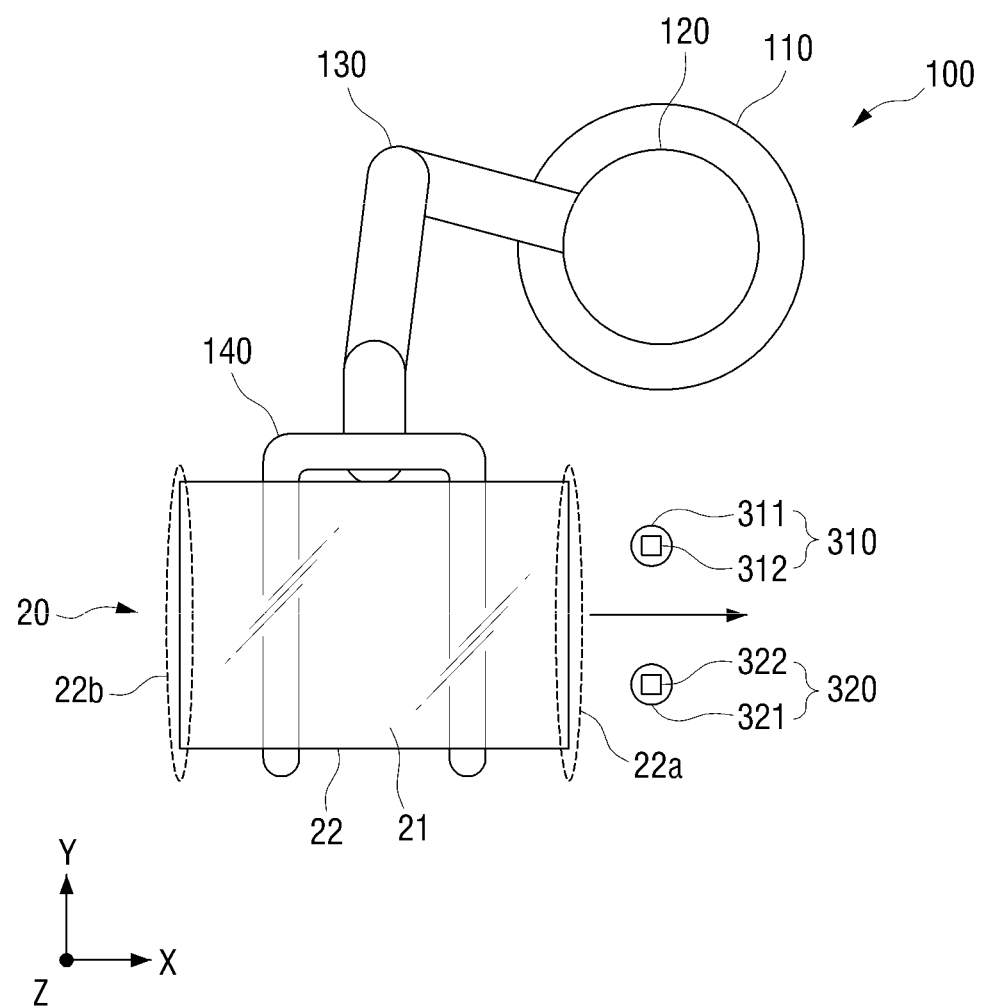
FIGS. 4 and 5 are views illustrating the transparent rectangular substrate passing through a light generator according to the exemplary embodiment of the present disclosure.
Figure 5:
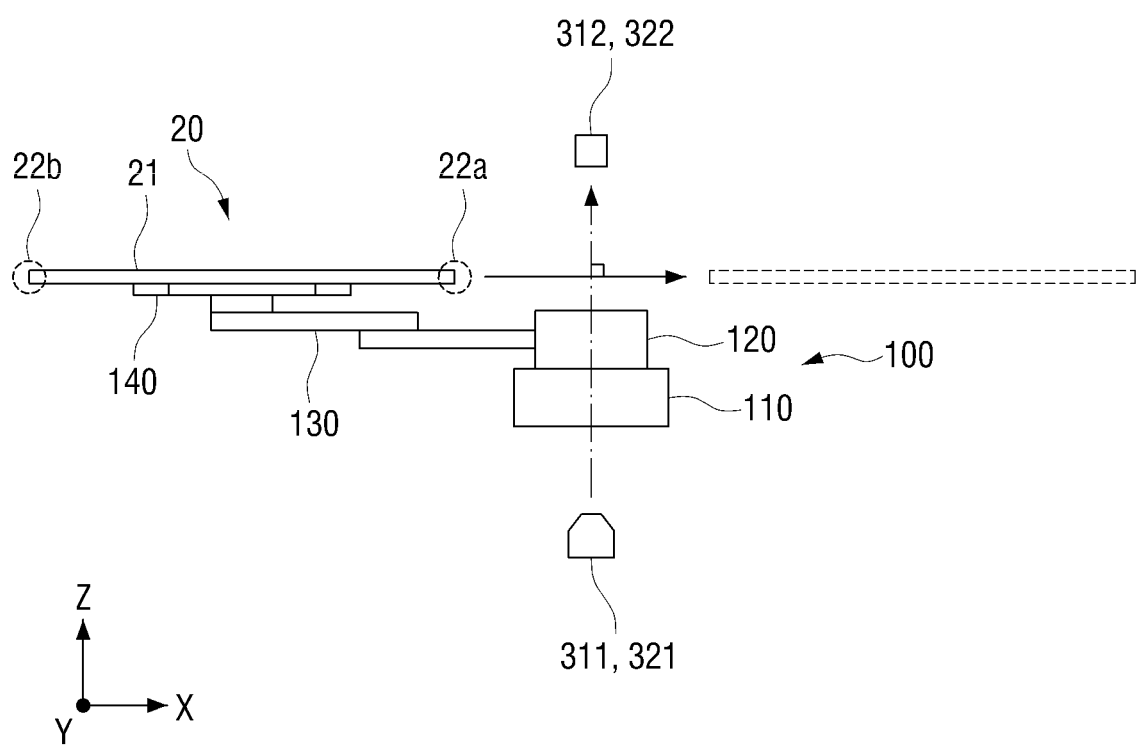

FIGS. 4 and 5 are views illustrating the transparent rectangular substrate passing through the light generator according to the exemplary embodiment of the present disclosure.

Referring to FIGS. 4 and 5, the transport part 100 may transport the transparent rectangular substrate 20 in a state in which the wide surface of the transparent rectangular substrate 20 is disposed to be parallel with the ground such that the transparent rectangular substrate 20 passes through the first light L1 and the second light L2 in a direction perpendicular to a light irradiation direction of the first light L1 and the second light L2.

The transport part 100 may move the transparent rectangular substrate 20 while allowing one side edge of the transparent rectangular substrate 20 (hereinafter, referred to as a first edge 22a) to preferentially pass through the first light L1 and the second light L2, and then an edge opposite the first edge 22a (hereinafter, referred to as a second edge 22b) to pass through the first light L1 and the second light L2. Accordingly, when the first light L1 and the second light L2 are irradiated onto the first edge 22a and the second edge 22b while the transparent rectangular substrate 20 is moved, the first light-sensing part 312 and the second light-sensing part 322 may not sense the first light L1 and the second light L2.

Figure 6:
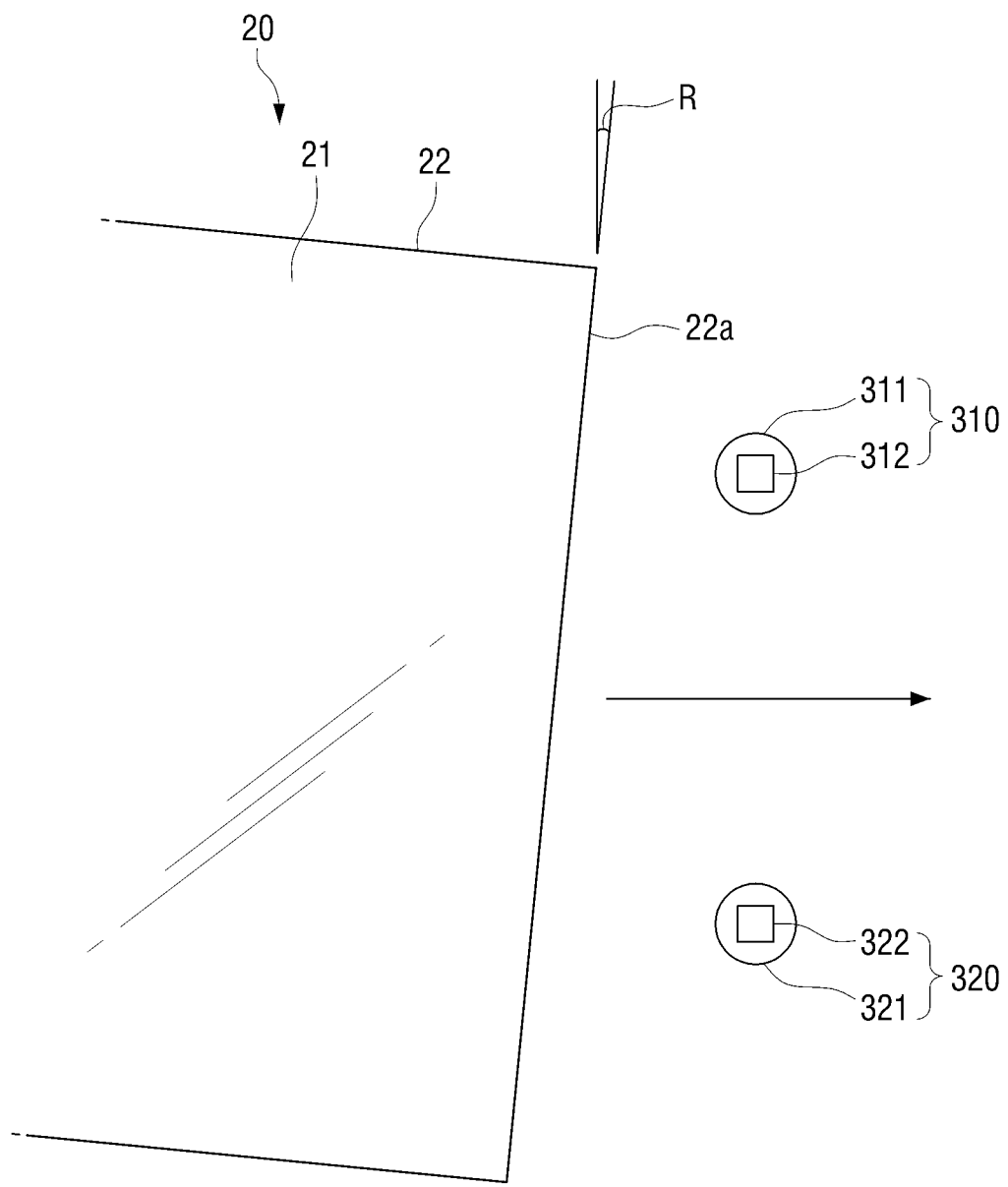
FIG. 6 is a view illustrating the transparent rectangular substrate according to the exemplary embodiment of the present disclosure passing through the light generator in a posture of being shifted from a default posture.
Figure 7:
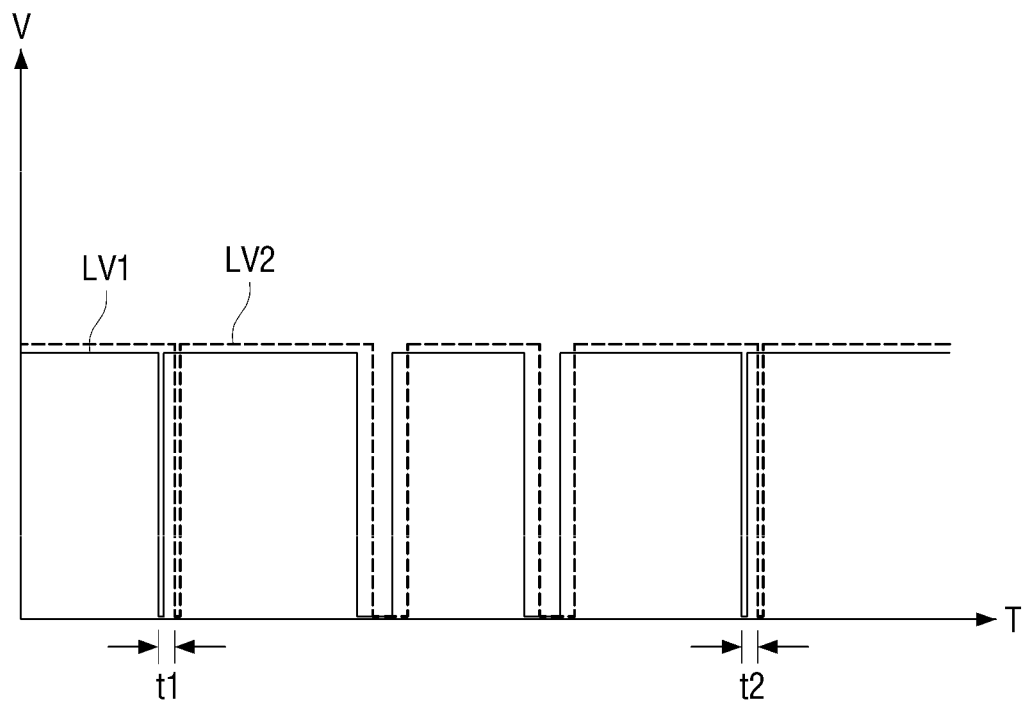
FIG. 7 is a view illustrating a pattern of light being sensed as the transparent rectangular substrate according to the exemplary embodiment of the present disclosure passes through the light generator.

FIG. 6 is a view illustrating the transparent rectangular substrate according to the exemplary embodiment of the present disclosure passing through the light generator in a posture of being shifted from the default posture, and FIG. 7 is a view illustrating a pattern of light being sensed as the transparent rectangular substrate according to the exemplary embodiment of the present disclosure passes through the light generator.

Referring to FIG. 6, the transparent rectangular substrate 20 may pass through the light generators 310 and 320 in a posture shifted from the default posture.

The posture of the transparent rectangular substrate 20 may be shifted from the default posture while the transport part 100 withdraws the transparent rectangular substrate 20 stored in the carrier and moves the transparent rectangular substrate 20 to the substrate support part 200. In the present disclosure, the default posture represents a posture of the transparent rectangular substrate 20 in which the first edge 22a and the second edge 22b of the transparent rectangular substrate 20 are parallel to the second direction Y. In addition, the posture of the transparent rectangular substrate 20 with respect to the default posture represents an angle formed between a direction in which the first light-sensing part 312 and the second light-sensing part 322 are disposed, that is, the second direction Y and the first edge 22a or the second edge 22b. FIG. 6 illustrates that an angle of "R" degrees is formed between the first edge 22a of the transparent rectangular substrate 20 and the second direction Y, and it may be understood that the angle of "R" degrees represents the posture of the transparent rectangular substrate 20 with respect to the default posture.

Referring to FIG. 7, as the transparent rectangular substrate 20 passes through the light generators 310 and 320, the light may be sensed by the light-sensing parts 312 and 322 in a constant pattern. In FIG. 7, a horizontal axis represents time, and a vertical axis represents the intensity of the sensed light.

In FIG. 7, a solid line represents the intensity of the first light L1 sensed by the first light-sensing part 312, and a dotted line represents the intensity of the second light L2 sensed by the second light-sensing part 322. Since the posture of the transparent rectangular substrate 20 is shifted with respect to the default posture, there is a time difference between time points at which the first light L1 and the second light L2 are not sensed at the first edge 22a and the second edge 22b. That is, first, the first light L1 is not sensed by the first light-sensing part 312, and after a predetermined period of time, the second light L2 is not sensed by the second light-sensing part 322. In addition, a section in which the first light L1 and the second light L2 are not sensed due to the hand 140 of the transport part 100 may be included.

The controller 400 may determine the posture of the transparent rectangular substrate 20 with respect to the default posture by using the time difference between the time point at which the first light L1 is not transmitted through the edge of the transparent rectangular substrate 20 and the time point at which the second light L2 is not transmitted through the edge of the transparent rectangular substrate 20. Here, the edge of the transparent rectangular substrate 20 is the first edge 22a or the second edge 22b, and the posture of the transparent rectangular substrate 20 with respect to the default posture represents the angle between the second direction Y and the first edge 22a or the angle between the second direction Y and the second edge 22b.

Figure 8:
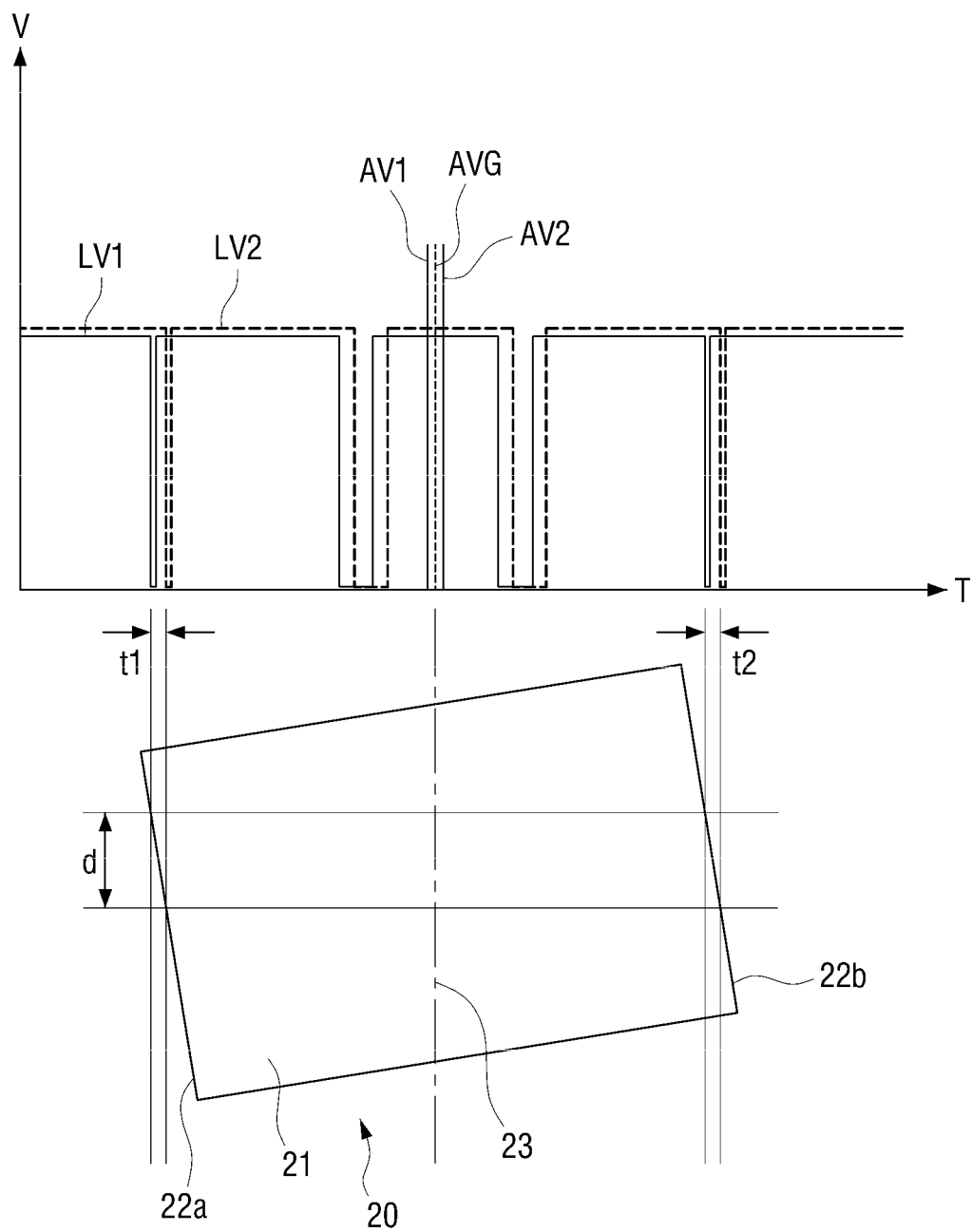
FIG. 8 is a view illustrating that a posture and a center line of the transparent rectangular substrate according to the exemplary embodiment of the present disclosure are determined.

FIG. 8 is a view illustrating that the posture and a center line of the transparent rectangular substrate according to the exemplary embodiment of the present disclosure are determined.

Referring to FIG. 8, the posture and the center line of the transparent rectangular substrate 20 may be determined by using the time points at which the first light L1 and the second light L2 are not transmitted.

The controller 400 may determine the posture of the transparent rectangular substrate 20 using a time difference t1 between a time point at which the first light L1 is not transmitted through the first edge 22a of the transparent rectangular substrate 20 and a time point at which the second light L2 is not transmitted through the first edge 22a of the transparent rectangular substrate 20. Alternatively, the controller 400 may determine the posture of the transparent rectangular substrate 20 using a time difference t2 between a time point at which the first light L1 is not transmitted through the second edge 22b of the transparent rectangular substrate 20 and a time point at which the second light L2 is not transmitted through the second edge 22b of the transparent rectangular substrate 20. The posture of the transparent rectangular substrate 20 with respect to the default posture may be determined to be t1/d or t2/d. Here, d denotes a distance between the first light-sensing part 312 and the second light-sensing part 322.

The controller 400 may determine a center line 23 of the transparent rectangular substrate 20 using a time difference between time points at which the first light L1 and the second light L2 are not transmitted through the first edge 22a of the transparent rectangular substrate 20 and time points at which the first light L1 and the second light L2 are not transmitted through the second edge 22b of the transparent rectangular substrate 20.

First, the controller 400 may confirm an intermediate time point (hereinafter, referred to as a first intermediate time point AV1) between the time point at which the first light L1 is not transmitted through the first edge 22a of the transparent rectangular substrate 20 and the time point at which the first light L1 is not transmitted through the second edge 22b of the transparent rectangular substrate 20. In addition, the controller 400 may confirm an intermediate time point (hereinafter, referred to as a second intermediate time point AV2) between the time point at which the second light L2 is not transmitted through the first edge 22a of the transparent rectangular substrate 20 and the time point at which the second light L2 is not transmitted through the second edge 22b of the transparent rectangular substrate 20. The controller 400 may determine a portion of the transparent rectangular substrate 20, which is corresponding to the first intermediate time point AV1 and the second intermediate time point AV2, as the center line 23.

The center line 23 of the transparent rectangular substrate 20 may be a straight line on a surface crossing a center point of the transparent rectangular substrate 20 and may be parallel to the second direction Y. The center line 23 of the transparent rectangular substrate 20 may be used to approximate the center point of the transparent rectangular substrate 20 to a center point of the substrate support part 200.

Figure 9:
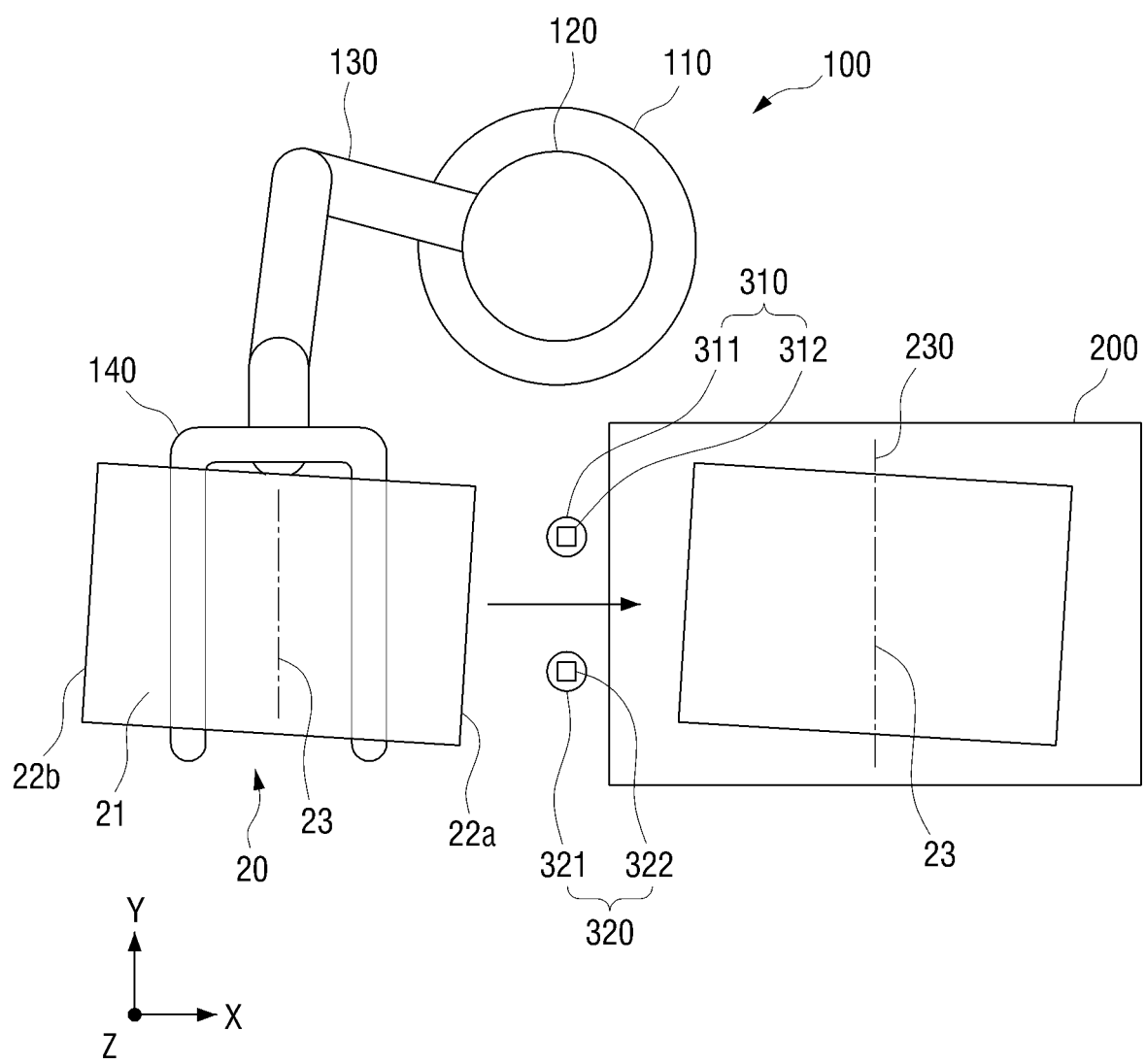
FIGS. 9 and 10 are views illustrating that the transparent rectangular substrate according to the exemplary embodiment of the present disclosure is being transported.
Figure 10:
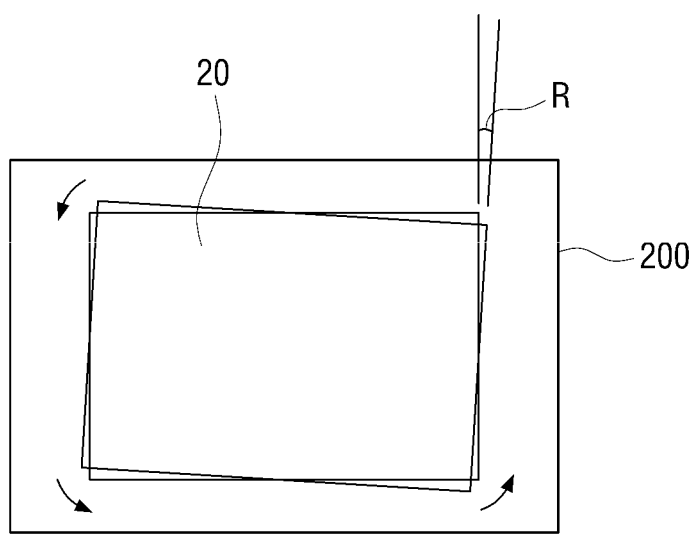
Figure 10:
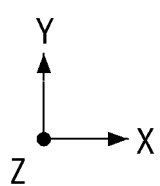

FIGS. 9 and 10 are views illustrating that the transparent rectangular substrate according to the exemplary embodiment of the present disclosure is being transported.

Referring to FIG. 9, the transport part 100 may move the transparent rectangular substrate 20 such that the transparent rectangular substrate 20 passes through the light generators 310 and 320.

The transport part 100 may move the transparent rectangular substrate 20 in the straight direction parallel to the ground, that is, in the first direction X. The light generators 310 and 320 may be disposed to be adjacent to the substrate support part 200. The light generators 310 and 320 may be disposed in a moving path of the transparent rectangular substrate 20, through which the transparent rectangular substrate 20 is moved to the substrate support part 200.

As the transparent rectangular substrate 20 passes through the light generators 310 and 320, the controller 400 may confirm the center line 23 of the transparent rectangular substrate 20. The controller 400 may control the transport part 100 such that the center line 23 of the transparent rectangular substrate 20 matches with the center line 230 of the substrate support part 200. In the present disclosure, the fact that the center line 23 of the transparent rectangular substrate 20 matches with the center line 230 of the substrate support part 200 represents the fact that the center line 230 of the substrate support part 200 and the center line 23 of the transparent rectangular substrate 20 are included on a virtual plane perpendicular to the ground. FIG. 9 illustrates that the center line 23 of the transparent rectangular substrate 20 that is moved above the substrate support part 200 matches with the center line 230 of the substrate support part 200.

Referring to FIG. 10, the posture of the transparent rectangular substrate 20 may be corrected. As the transparent rectangular substrate 20 passes through the light generators 310 and 320, the controller 400 may confirm the posture of the transparent rectangular substrate 20 with respect to the default posture, that is, the angle R formed between the second direction Y and the first edge 22a of the transparent rectangular substrate 20 or formed between the second direction Y and the second edge 22b of the transparent rectangular substrate 20.

The controller 400 may control the transport part 100 such that the posture of the transparent rectangular substrate 20 is corrected by the confirmed angle R. After correcting the posture of the transparent rectangular substrate 20, the transport part 100 may seat the transparent rectangular substrate 20 on the substrate support part 200. Processes may be performed while the transparent rectangular substrate 20 is supported on the substrate support part 200 in the default posture.

Although the exemplary embodiments of the present disclosure have been described with reference to the accompanying drawings, it will be understood by those skilled in the art that the disclosure may be performed in other concrete forms without changing the technological scope and essential features. Therefore, the above-described exemplary embodiments should be considered as only examples in all aspects and not for purposes of limitation.

What is claimed is:

1. A substrate treatment apparatus comprising:
   a transport part configured to transport a transparent rectangular substrate;
   a substrate support part configured to support the transported transparent rectangular substrate;
   light generators configured to irradiate two different lights onto the transparent rectangular substrate, which is moving, and sense the irradiated lights; and
   a controller configured to determine a posture of the transparent rectangular substrate with reference to the sensed lights and control the transport part such that the transparent rectangular substrate is seated on the substrate support part in a default posture that is preset,
   wherein the controller determines the posture of the transparent rectangular substrate with respect to the default posture using a time difference between a time point at which a first light of the two different lights is not transmitted through an edge of the transparent rectangular substrate and a time point at which a second light of the two different lights is not transmitted through the edge of the transparent rectangular substrate, and
   wherein the controller determines a center line of the transparent rectangular substrate using the time difference between time points at which the first light and the second light are not transmitted through the edge of the transparent rectangular substrate and time points at which the first light and the second light are not transmitted through an opposite edge to the edge.

2. The substrate treatment apparatus of claim 1, wherein the light generators include:
   a first light-irradiating part and a second light-irradiating part that are configured to irradiate the first light and the second light in a direction perpendicular to the ground, respectively; and
   a first light-sensing part and a second light-sensing part that are disposed above or below the first light-irradiating part and the second light-irradiating part, respectively, in a straight line parallel to the ground to sense the irradiated first and second lights, respectively.

3. The substrate treatment apparatus of claim 2, wherein the transport part moves the transparent rectangular substrate in a state in which a wide surface of the transparent rectangular substrate is disposed to be parallel to the ground such that the transparent rectangular substrate passes through the first light and the second light in a direction perpendicular to a light irradiation direction of the first light and the second light.

4. The substrate treatment apparatus of claim 2, wherein the posture of the transparent rectangular substrate with respect to the default posture includes an angle formed between a direction in which the first light-sensing part and the second light-sensing part are disposed and the edge of the transparent rectangular substrate.

5. The substrate treatment apparatus of claim 1, wherein the controller controls the transport part such that the center line of the transparent rectangular substrate matches with a center line of the substrate support part.

* * * * *